INVENTORS
AGOSTINO LUNA
ROBERTO CAFISSI
BY C. A. Gulbrandsen
ATTY.

INVENTORS
AGOSTINO LUNA
ROBERTO CAFISSI
BY C. A. Gulbrandsen
ATTY.

United States Patent Office 3,371,289

Patented Feb. 27, 1968

3,371,289

WIDE BAND FREQUENCY MODULATOR, OF THE SOLID STATE TYPE, WITH LINEAR CHARACTERISTICS

Agostino Luna and Roberto Cafissi, Milan, Italy, assignors to Automatic Electric Laboratories, Inc., Northlake, Ill., a corporation of Delaware Continuation-in-part of application Ser. No. 407,964, Nov. 2, 1964. This application July 30, 1965, Ser. No. 475,983

2 Claims. (Cl. 332—14)

ABSTRACT OF THE DISCLOSURE

A frequency modulator employs a free-running, astable multivibrator as a variable frequency oscillator. Linear charging and discharging of the emitter coupling capacitor of the multivibrator is insured by a pair of constant current generators connected thereacross, the output of one of the generators being variable in response to the modulating signal. A variable load circuit connected to the collector of one transistor of the multivibrator and to the base of the other transistor includes a diode which is conductive with the said one transistor to define one trigger level and a reactive circuit connected to the diode and said one transistor provides a second trigger level across the diode when the diode becomes non-conductive.

This application is a continuation-in-part of our United States patent application, Wide Band Frequency Modulator of the Solid State Type with Linear Characteristics, Ser. No. 407,964, filed Nov. 2, 1964.

In the parent application we decribe a frequency modulator whose modulation characteristic is made substantially linear by substituting for the frequency fixing element of its multivibrator a special circuit, which in addition to fixing the frequency of the multivibrator, varies its own characteristics so as to make its modulation characteristic linear.

According to one embodment of the invention described in the parent application a multivibrator comprising two transistors has substituted for the load resistance of one of these transistors a linearizing circuit which includes a first resistance inserted in series with a diode, the combination of which is connected between the collector of the transistor and a terminal having a predetermined biasing potential, and a second resistance connected between the junction of the first resistance and the diode and another terminal having another predetermined biasing potential.

It has been found that a linearizing circuit as mentioned above has the disadvantage that its linearization is subject to the diode characteristic linked to the reverse recovery time. In such a circuit it is necessary to employ a diode havig a high reverse recovery time which performs the dual functions of defining in the conductive stages the first of two voltage levels between which the multivibrator oscillates (minus the voltage drop at the terminals of the resistance in series therewith) and in the blocked stage by means of the behavior time of the reverse current, a phenomenon linked to the reverse recovery time, generating the potential of the junction between the diode and the first resistance through the second linearizing resistance. The second level is therefore characterized by a behavior with frequency favorable to the conditions of linearity.

It has been further found that it is possible to free the linearization of the circuit from the characteristics of the diode, which permits first of all, the employment of fast acting diodes of a greater variety of types. In addition there is obtained a substantial improvement with respect to the noise introduced by the modulator.

According to the above findings, the diode retains the indispensable function of defining, in its conductive phase, and always less the voltage drop at the terminals of the first resistance which is equivalent to the above noted first resistance, the first of two triggering levels of the multivbrator. By means of a reactive circuit which forms a linearizing circuit, a second triggering level is obtained by creating a transient voltage at the terminals of the completely blocked diode.

It is the primary object of the invention to provide an improved solid state wide band frequency modulator arrangement.

A more particular object of the invention is to provide a wide band frequency modulator of the solid state type having improved linear characteristics.

The invention is realized in one particular embodiment thereof as comprising a multivibrator formed of two transistors, one of which has a linearization circuit including essentially a first resistance in series with the diode inserted between the collector of one of the transistors and a terminal having a predetermined biasing potential, and a second resistance inserted between the junction of the first resistance and the diode and a second terminal having another predetermined biasing potential, as we described in our above-mentioned parent application and improved by employing a second resistance connected to a source of supply through a reactive circuit which comprises a third resistance and an inductance connected in parallel, and further a capacitance interposed between the point of connection of the second resistance with the reactor circuit and ground.

The invention will be best understood from the following description, given purely by way of non-limitive examples of two forms of its execution, taken in conjunction with the accompanying drawings in which.

Figure 1:
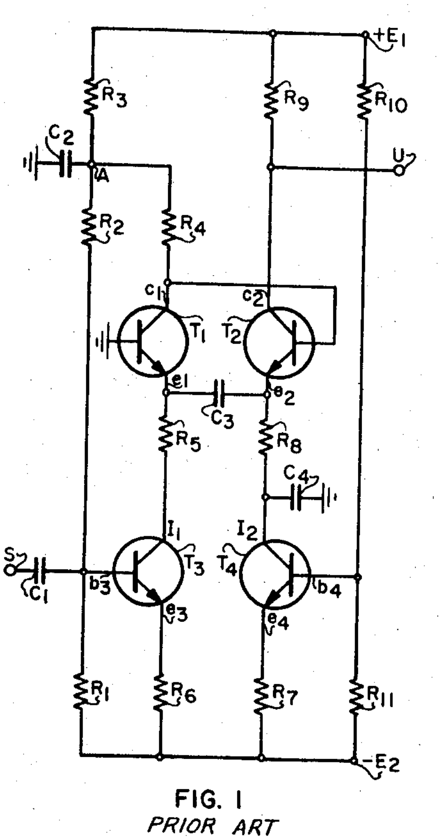
FIG. 1 PRIOR ART
FIG. 1 is a schematic representation of a prior art transistor multivibrator.
Figure 2:
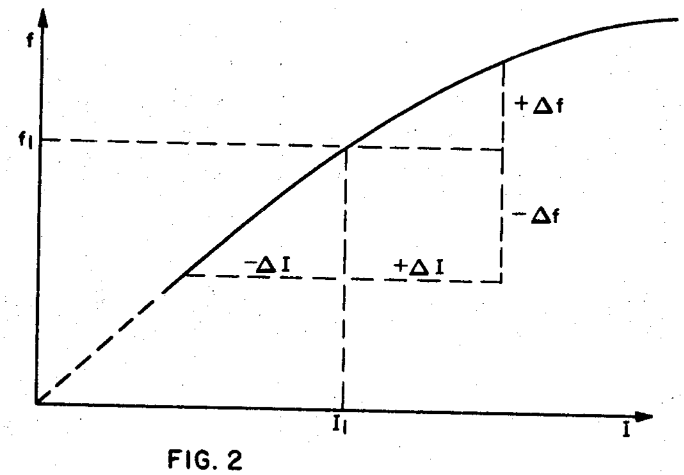
FIG. 2 is a graphical representation of the behavior of frequency as a function of the current of one of the multivibrator transistors of FIG. 1.

The multivibrator of FIG. 1 and its operation are well known in the art and will not be discussed herein other than to note that the frequency of the alternate blocking and conductive phases of transistors $T_1$ and $T_2$ is basically determined by capacitance $C_3$ and resistance $R_4$. Transistors $T_3$ and $T_4$ serve as constant current generators with current $I_1$ being variable in accordance with a signal at terminal S. Terminal U is the output terminal. The graphical illustration of the frequency-current relationship of the above modulator is shown in FIG. 2. Assuming that $f_1$ is the center frequency of the multivibrator, equal changes in current about $I_1$ ($-\Delta I$ to $+\Delta I$) provide unequal changes ($-\Delta f, +\Delta f$) in frequency.

Figure 3:
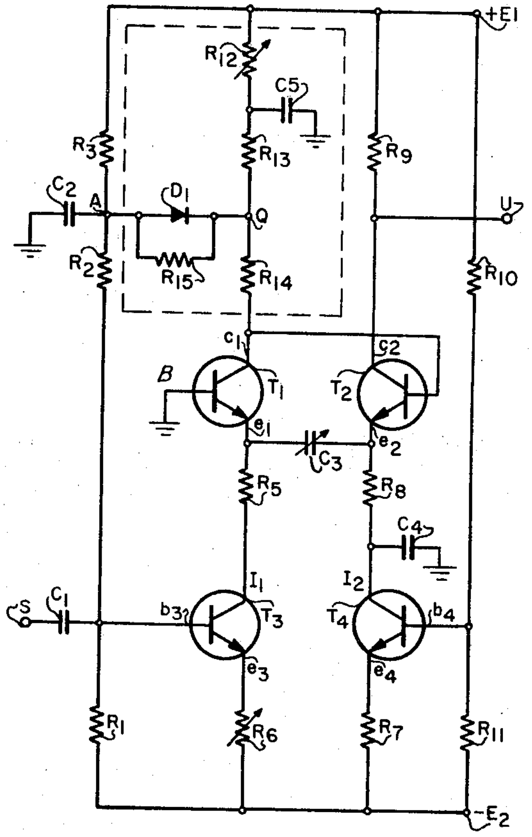
FIG. 3 is a schematic representation of the multivibrator of FIG. 1 equipped with a linearizing circuit according to the teachings in the parent application.

In FIG. 3, resistance $R_4$ has been replaced by a linearization circuit whose resistance decreases as $(I_1+I_2)$ increases as brought out in the parent application. A decrease in resistance will cause an increase in frequency due to the modification of the associated time constant. Diode $D_1$ and transistor $T_1$ are conductive at the same time and blocked at the same time. The sudden voltage rise at the collector of $T_1$ is limited and defined by the potential difference between points A and Q when transistor $T_1$ is blocked.

In the theoretical expression $$f=\frac{I_1I_2}{C_3\Delta V(I_1+I_2)} \qquad (1)$$

it can be seen that the term $(I_1+I_2)$ a perfect linearity cannot be obtained; however, in practice other phenomena associated with the alteration of the waveform cause linearity to be better than what is theoretically predictable.

Figure 4:
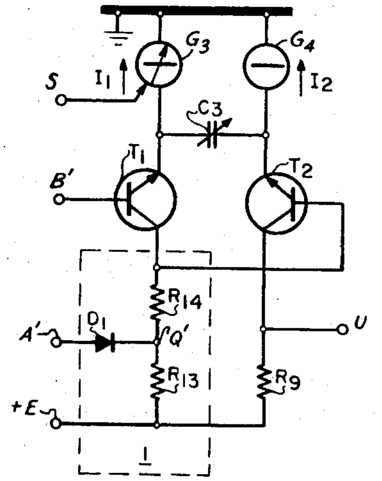
FIG. 4 is a schematic representation of a two transistor multivibrator which employs a linearization circuit according to our above-mentioned patent application, wherein, for simplicity, the constant current generators are symbolically shown and the voltage dividers have been omitted.

Referring to FIG. 4, a symbolic representation of an arrangement of FIG. 3 is shown in which it is seen that of the two transistors $T_1$ and $T_2$, the first has its load resistance replaced by a linearization circuit included inside of the rectangle 1. This circuit includes a resistance $R_{14}$ in series with a diode $D_1$ having its anode connected to terminal $A^1$, which may be constituted of a tap on a voltage divider (as shown in FIG. 3) inserted at the terminals of a source of supply +E for the transistors. Since FIG. 4 is shown with all potentials above ground, junctions similar to those in FIG. 3 have been referenced with the reference character of FIG. 3 and further referenced with a prime (i.e. A'). A linearization resistance $R_{13}$ is inserted between the point of the connection Q' of the diode $D_1$ and the resistance $R_{14}$ supply terminal +E. $I_1$ and $I_2$ of course denote current generators $G_3$ and $G_4$ which corresponds to transistors $T_3$ and $T_4$ of FIGS. 1 and 3, generator $G_3$ having it output variable, as indicated by the slanted arrow, in response to a modulating signal applied at terminal S. The operation of this circuit has just been described. FIG. 4 is included in this symbolic form to aid in a simple and clear showing of FIGS. 5 and 6.

Figure 5:
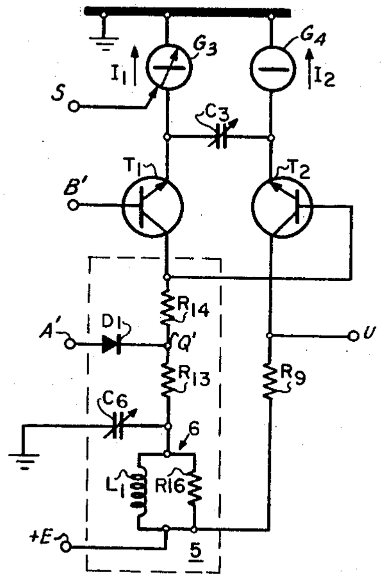
FIG. 5 is a schematic representation of an embodiment of the invention equipped with another linearizing circuit.

In FIG. 5 there is shown a multivibrator according to the present invention, in which the circuit shown inside of the rectangle 1 of FIG. 4 has been modified and shown as the part included within the rectangle 5. As may be seen, between the terminal 4 and the resistance $R_{13}$ there has been inserted a reactive circuit 6 including an inductance $L_1$ and a resistance $R_{16}$ connected in parallel with each other. A variable capacitance $C_6$ is inserted between the point of connection of the reactive circuit 6 with the resistance $R_{13}$ and ground.

The operation of the circuit of FIG. 5 is as follows. Upon the application of a modulating signal at terminal S, the frequency of oscillation of the multivibrator taken at output terminal U may also be determined by Expression 1. The term ΔV which appears therein represents the value of the jump in voltage existing between the two triggering levels of the multivibrator and may be represented in a first approximation as:

$$\Delta V=R_{14}(I_1+I_2)+V_D+V(T) \qquad (2)$$

$V_D$ indicates the voltage which is localized at the terminals of the diode in the conduction phase, and V(T) indicates the value of the voltage which is localized at the terminals of the diode during the blocked phase.

In the circuit of FIG. 3, the behavior of voltage V(T) as a function of time is regulated by the behavior of the reverse current involving the diode in the period following its state of conduction, while in the case of the circuit according to FIG. 5 of the present invention, the desired behavior of V(T) as a function of time is realized by appropriately dimensioning the reactive circuit $L_1$, $R_{16}$, $C_6$.

The regulation of the reactive circuit is effected by varying capacitance $C_6$. It would be further possible to maintain $C_6$ at a fixed value and adjust inductance $L_1$.

Figure 6:
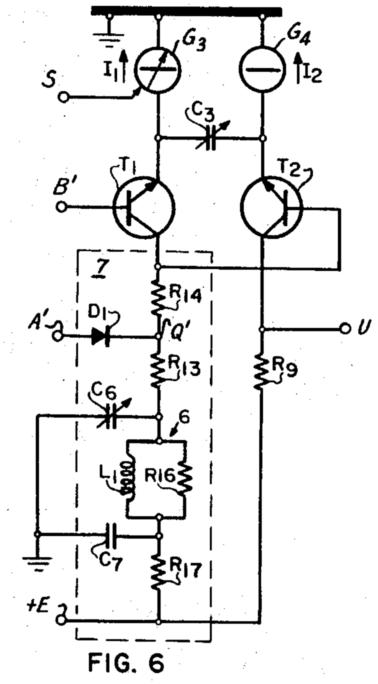
FIG. 6 is a schematic representation of another embodiment of the invention with yet another linearizing circuit.

In FIG. 6 is shown another embodiment of the invention that is similar to that of FIG. 5, in which however, the linearization circuit 7 is completed by a capacitance $C_7$ inserted between ground and the end of the reactive circuit 6 which is opposite to that connected to the capacitance $C_6$, and further by a resistance $\theta_{17}$ inserted between the reactive circuit 6 and the supply terminal +E. The purpose of the inclusion of elements $C_7$ and $R_{17}$ is to render resistive the impedance presented by the circuit to the base frequency components which are closed through this path.

Although specific embodiments of the invention have been shown, it is obvious that numerous variants and modifications may be made in the invention by one skilled in the art without departing from the spirit and scope of the invention and should be included in the appended claims:

What is claimed is:

1. A frequency modulator comprising: a multivibrator including first and second alternately conducting transistors, each said transistor having a base, an emitter and a collector, a capacitor connected between said emitters, the frequency of oscillation being dependent on the values of said capacitor, the emitter current of said first transistor and the voltage change at the collector of said first transistor when it passes from a non-conducting to a conducting condition, first and second current generators respectively connected to said two emitters to provide linear charging and discharging of said capacitor, said first current generator including an input for receiving a modulating signal, the output current of said first current generator being dependent on the amplitude of said modulating signal, an output terminal connected to the collector of said second transistor, a source of direct current potentials coupled to said first and second current generators, and a voltage divider linearizing network connected between said source of direct current potentials and the collector of said first transistor, said network including a diode connected in shunt between a first potential of said source and said first transistor and poled to be conductive when said first transistor is conductive and non-conductive when said first transistor is non-conductive, an inductor connected between a second potential of said source and said diode and said first transistor for developing a voltage across said diode when said diode becomes non-conductive, and a second capacitor shunted to ground between said inductor and said diode, said voltage change at the collector of said first transistor being maintained constant and defined by the potential change across said diode as it alternates between conductive and non-conductive conditions.

2. The frequency modulator defined in claim 1, and further comprising a third capacitor connected between the junction of said second potential of said source with said inductor and ground, the reactance of said third capacitor combining with the reactance of said inductor to provide the appearance of a resistive impedance.

References Cited

UNITED STATES PATENTS

| | | | |
|---|---|---|---|
| 3,061,799 | 10/1962 | Biard | 332—14 |
| 3,127,554 | 3/1964 | Kaneko | 332—14 X |
| 3,171,041 | 2/1965 | Haase | 307—88.5 |
| 3,178,658 | 4/1965 | Henrion. | |
| 3,290,617 | 12/1966 | Bellem | 332—14 |

ALFRED L. BRODY, *Primary Examiner.*